(12) United States Patent
Vinciarelli et al.

(10) Patent No.: US 8,085,541 B1
(45) Date of Patent: Dec. 27, 2011

(54) THIN FLAT PANEL VIDEO DISPLAY

(75) Inventors: Patrizio Vinciarelli, Boston, MA (US); Michael B. Lafleur, East Hampstead, NH (US)

(73) Assignee: VLT, Inc., Sunnyvale, CA (US)

( * ) Notice: Subject to any disclaimer, the term of this patent is extended or adjusted under 35 U.S.C. 154(b) by 130 days.

(21) Appl. No.: 12/423,447

(22) Filed: Apr. 14, 2009

Related U.S. Application Data

(60) Provisional application No. 61/045,194, filed on Apr. 15, 2008, provisional application No. 61/045,110, filed on Apr. 15, 2008.

(51) Int. Cl.
*H05K 7/20* (2006.01)
*G02F 1/1335* (2006.01)

(52) U.S. Cl. ............... 361/704; 361/77; 165/104.33; 349/58

(58) Field of Classification Search ............... None
See application file for complete search history.

(56) References Cited

U.S. PATENT DOCUMENTS

| | | |
|---|---|---|
| 3,699,394 A | 10/1972 | Schuler |
| 5,258,888 A | 11/1993 | Korinsky |
| 5,365,403 A | 11/1994 | Vinciarelli et al. |
| 5,728,600 A | 3/1998 | Saxelby, Jr. et al. |
| 5,835,350 A | 11/1998 | Stevens |
| 5,887,435 A | 3/1999 | Morton |
| 5,920,119 A | 7/1999 | Tamba et al. |
| 6,005,773 A | 12/1999 | Rozman et al. |
| 6,356,448 B1 | 3/2002 | DiBene et al. |
| 6,403,009 B1 | 6/2002 | Saxelby, Jr. et al. |
| 6,434,005 B1 | 8/2002 | Vinciarelli et al. |
| 6,623,281 B2 | 9/2003 | Vinciarelli et al. |
| 6,930,893 B2 | 8/2005 | Vinciarelli et al. |
| 7,149,088 B2 | 12/2006 | Lin et al. |
| 7,157,850 B2 * | 1/2007 | Miyazaki et al. ............. 313/495 |
| 7,173,824 B2 | 2/2007 | Laurent et al. |
| 7,206,204 B2 | 4/2007 | Nakatsu et al. |
| 7,236,368 B2 | 6/2007 | Maxwell et al. |
| 7,361,844 B2 | 4/2008 | Vinciarelli et al. |
| 7,375,974 B2 | 5/2008 | Kirigaya |
| 7,425,949 B2 * | 9/2008 | Lin et al. ............. 345/211 |
| 7,457,120 B2 * | 11/2008 | Bae et al. .............. 361/704 |
| 7,495,918 B2 * | 2/2009 | Lee .................... 361/707 |
| 7,518,668 B2 * | 4/2009 | Kim ...................... 349/57 |
| 7,639,489 B2 * | 12/2009 | Miyoshi et al. .......... 361/679.34 |
| 7,764,022 B2 * | 7/2010 | Ogura et al. ................. 315/291 |
| 7,777,698 B2 * | 8/2010 | Takahara et al. ............. 345/76 |
| 7,839,396 B2 * | 11/2010 | Yang et al. .................. 345/204 |
| 2005/0212790 A1 * | 9/2005 | Lin et al. ..................... 345/204 |
| 2008/0136847 A1 * | 6/2008 | Yajima et al. ............... 345/690 |

* cited by examiner

*Primary Examiner* — Boris L Chervinsky
(74) *Attorney, Agent, or Firm* — Fish & Richardson P.C.

(57) ABSTRACT

This document describes apparatus and methods for supplying electrical operating power to a thin form-factor display device, such as a flat panel video display device. In an illustrative example, components of a power supply for a flat panel video display are arranged to be substantially coplanar and adjacent to a display screen. The display screen and the power supply components may share a common housing. The power supply may provide appropriate electrical operating voltages to operate the display device. In some embodiments, an external thermally conductive panel of the display device is thermally coupled to components of the power supply through a low thermal impedance interface.

23 Claims, 17 Drawing Sheets

THIN FLAT PANEL VIDEO DISPLAY

CROSS REFERENCE TO RELATED APPLICATIONS

This application claims priority to Vinciarelli et al., Thin Flat Panel Video Display, U.S. Provisional Application Ser. No. 61/045,194, filed on Apr. 15, 2008 (the "Flat TV Provisional Application"); and Vinciarelli et al., System and Apparatus for Efficient Heat Removal From Heat-Generating Electronic Modules, U.S. Provisional Application Ser. No. 61/045,110, filed on Apr. 15, 2008 (the "Thermal Cavity Provisional Application"); both of which are incorporated herein by reference in their entirety.

TECHNICAL FIELD

Various embodiments may relate generally to arrangements for components in thin video display devices.

BACKGROUND

Display devices are electronic systems used to display images, such as still images and video images. The content of the images can range from text to graphics to live video, for example. In some cases, the images may be coupled with audio information. Television and computer terminals are two applications for display devices.

Generally, display devices can operate to display two dimensional images on a screen. The screen may be supported by a housing, which protects electronic components that operate to render images on the screen.

The electronic components that serve to render images generally cooperate to receive a signal that contains information to be displayed on the screen. In some systems, the image processing circuitry processes the received signal to produce enough signals to control each display pixel (or small portions of the display screen) to render the image. In various systems, the signal processing circuitry may be analog, digital, or a combination thereof.

The signal processing circuitry may require a number of voltages, each within prescribed voltage ranges, in order to perform reliable signal processing operations that render images on the screen of the display device.

SUMMARY

This document describes apparatus and methods for supplying electrical operating power to a thin form-factor display device, such as a flat panel video display device. In an illustrative example, components of a power supply for a flat panel video display are arranged to be substantially coplanar and adjacent to a display screen. The display screen and the power supply components may share a common housing. The power supply may provide appropriate electrical operating voltages to operate the display device. In some embodiments, an external thermally conductive panel of the display device is thermally coupled to components of the power supply through a low thermal impedance interface.

In one exemplary aspect, a method of making a thin flat panel display includes a number of steps. Steps include providing a display having a display area with four sides that define a display length and a display height, providing electronic circuitry to operate the display, and providing power supply circuitry to convert power from an AC source and provide a number of DC output voltages to power the display and electronic circuitry. Further steps include dividing the power supply circuitry into a front end system and a regulator system, the front end system having an input for connection to the AC source and an output for providing a unipolar voltage to an input of the regulator system. The regulator system has a number of outputs for providing the plurality of DC output voltages. Steps further include providing in the front end system the functions of voltage transformation and isolation, and providing in the regulator system the function of regulation, and providing energy storage for connection to an intermediate voltage of the power system. Additional steps include arranging the front end system in an area adjacent to and outside of the display area along one or more of the sides of the display area, arranging the regulator system in an area adjacent to and outside of the display area along one or more of the sides of the display area, and providing a frame including a thermally conductive portion thermally coupled to the front end system for spreading heat dissipated by the power supply circuitry.

In some embodiments, the method may include thermally coupling a portion of the regulator system to the frame. The regulator system may include a module mounted to the frame. The regulator system may include a regulator circuit external to the module. The module may be separated from the front end system by a threshold distance of at least 10 percent of the display length.

In another exemplary aspect, a method for use with a thin flat panel display includes, dissipating from an area outside of a display area of the display, heat from a front end power supply system through a thermally conductive portion of a frame of the display. The front end power supply system may be adapted to be connected to an AC source. The method further includes, dissipating from a separate area outside of the display area, heat from a regulator system that is (i) distinct from, (ii) connected to the front end power supply system, and (iii) adapted to supply DC voltages to the display.

In another exemplary aspect, a flat panel display includes a display with a display area having four sides defining a display length and a display height. The flat panel display further includes electronic circuitry to operate the display. The electronic circuitry includes a) front-end circuitry configured to receive power from an AC power source and convert the received power to a unipolar voltage, and b) regulator circuitry that receives the unipolar voltage and provides a plurality of DC output voltages to power the display and corresponding display driver circuitry. The flat panel display also includes a thermally conductive frame to which the display is attached and on which the electronic circuitry is mounted, the thermally conductive frame having a thickness that is generally perpendicular to the display length and display height. The front-end circuitry is mounted in a first portion of the frame, and the regulator circuitry is mounted in a second portion of the frame. The first portion and second portion are separated by a threshold distance.

In some embodiments of the flat panel display, the first portion and the second portion are disposed adjacent to one side of the display. The threshold distance may be about at least 10%, 25%, 50% or more of a length of the one side.

In some embodiments, the flat panel display thickness may be less than or equal to about 10 or about 13 mm. The display and electronic circuitry may be disposed entirely within a space bounded by a length and width of the thermally conductive frame and the thickness. The thermally conductive frame may be made at least partially of aluminum.

In another exemplary aspect, a flat panel display includes a display with a display area having four sides defining a display length and a display height, and electronic circuitry to operate the display. The electronic circuitry includes a) front-end circuitry configured to receive power from an AC power source and convert the received power to a unipolar voltage, and b) regulator circuitry that receives the unipolar voltage and provides a number of DC output voltages to power the display and corresponding display driver circuitry. The flat panel display further includes a thermally conductive frame to which the display is attached and on which the electronic circuitry is mounted. The front-end circuitry is mounted in a first portion of the frame, and the regulator circuitry is separately mounted in a second, different portion of the frame. The first portion and second portion are separated by a threshold distance.

In some embodiments, the display length and the display height may have a ratio of approximately 15:9, wherein the display area includes at least about 775 square inches. The display area may include about at least 775, 1275, or 1575 square inches. The display area may include at least about 175 square inches, and the display length and the display height may have a ratio of approximately 1280:1024.

The thermally conductive frame may have a thickness that is generally perpendicular to the display length and display height, within which the display and electronic circuitry are disposed. The thickness may be less than about 10 or 13 mm. The front end system may be separated from the regulator system by a threshold distance of at least 10 percent of the display length. A portion of the regulator system may be thermally coupled to the frame. The regulator system may include a module that is mounted to the frame. The regulator system may include a regulator circuit external to the module. The module may be separated from the front end system by a threshold distance of at least 10 percent of the display length.

In another exemplary aspect, a display includes a display panel, front-end circuitry, and regulator circuitry. The front-end circuitry receives power from an AC power source and converts the received power to a unipolar voltage. The regulator circuitry receives the unipolar voltage and provides DC output voltages to power the display. A thermally conductive frame has a first portion for mounting the front-end circuitry and a second portion for mounting the regulator circuitry, the first and second portions being separated by at least 10% of a width of the display panel.

In some embodiments, the first portion of the frame includes a flange that is thermally coupled to a heat removal device of the front-end circuitry. The flange includes an inside flange surface that is recessed relative to a surface of the frame, the inside flange matching with a surface of the heat removal device.

Some embodiments may achieve one or more advantages. For example, some examples may yield display devices with substantially reduced thickness form factors, such as less than about 10 mm, for example. Some implementations may yield substantially improved thermal management, for example, through thermal interfaces between power supply modular components and a thermally conductive panel, as described in this document. Synergistic results may include reduced assembly labor and enhanced serviceability using modular power conversion subcomponents in combination with various thermal management and/or form factor advantages. Reduced display device weight may be achieved through substantial reduction or elimination of passive (e.g., heat sinks) and/or active (e.g., fans, liquid) cooling systems.

The details of one or more embodiments are set forth in the accompanying drawings and the description below. Other features, objects, and advantages will be apparent from the description and drawings, and from the claims.

BRIEF DESCRIPTION OF DRAWINGS

Like reference symbols in the various drawings indicate like elements.

DETAILED DESCRIPTION

Efficient heat removal from power components and more specifically power converters is described in Vinciarelli et al., System and Apparatus for Efficient Heat Removal From Heat-Generating Electronic Modules, U.S. application Ser. No. 12/423,417, filed Apr. 14, 2009, and assigned to the same assignee as this application (the Thermal Cavity Application") the entire contents of which is herein incorporated by reference. Unless defined differently herein, terminology used in this application will have the meanings used in the Thermal Cavity Application.

Figure 1:
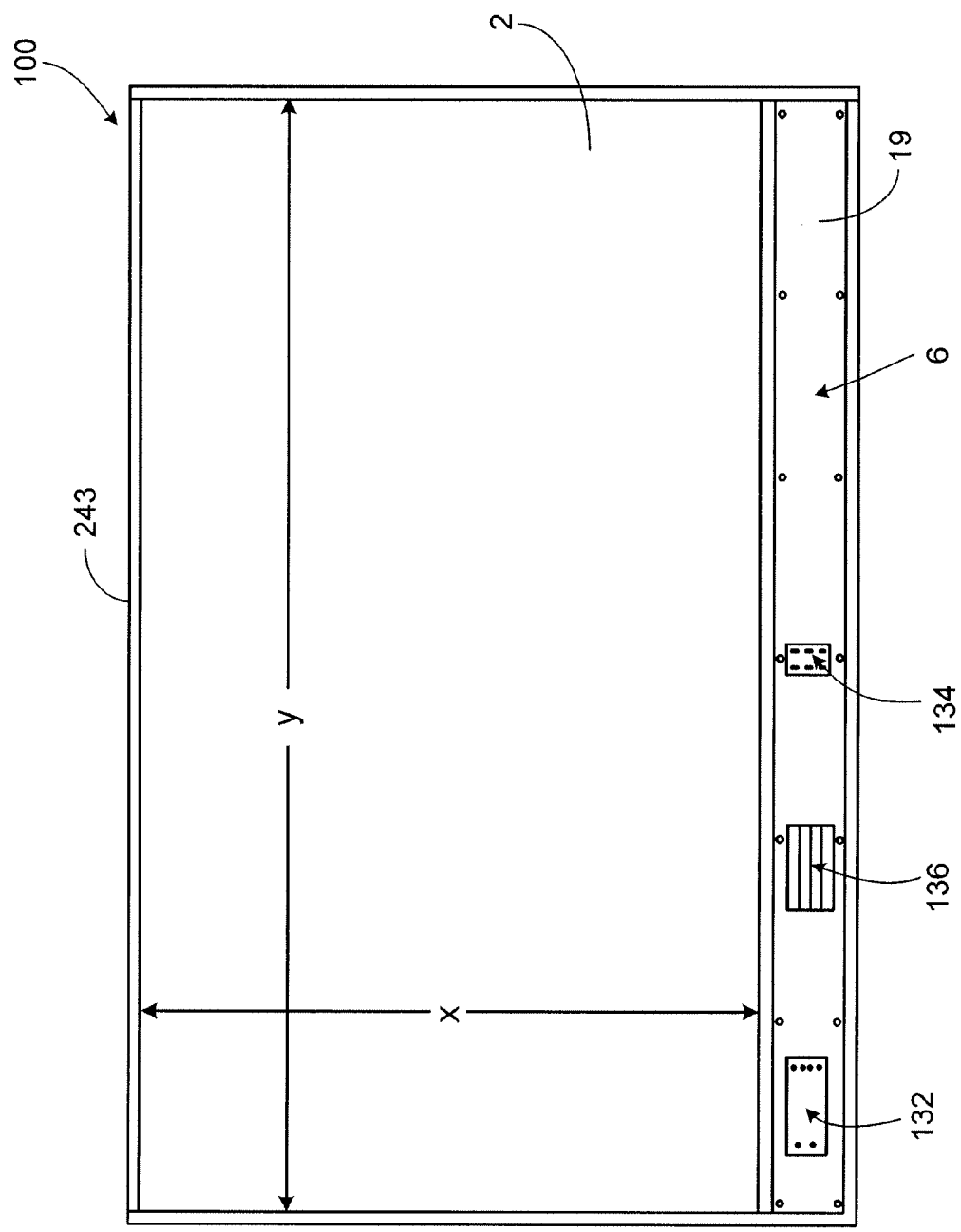
FIG. 1 shows an exemplary front view of a flat-panel video display.
Figure 2:
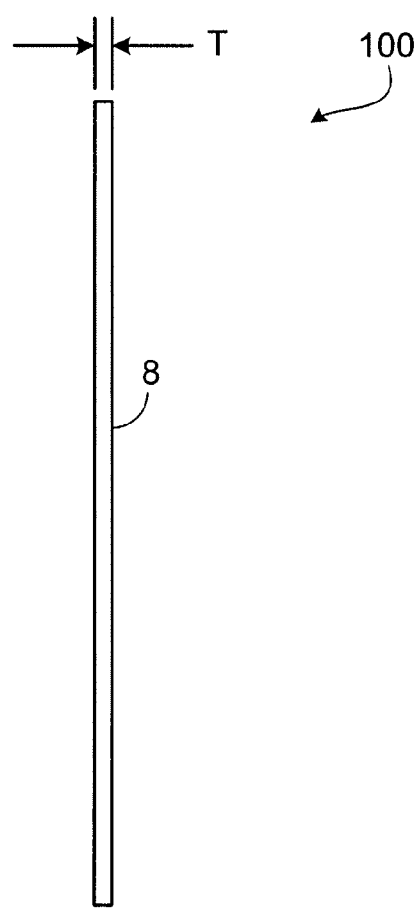
FIG. 2 shows an exemplary side view of the display of FIG. 1.
Figure 3:
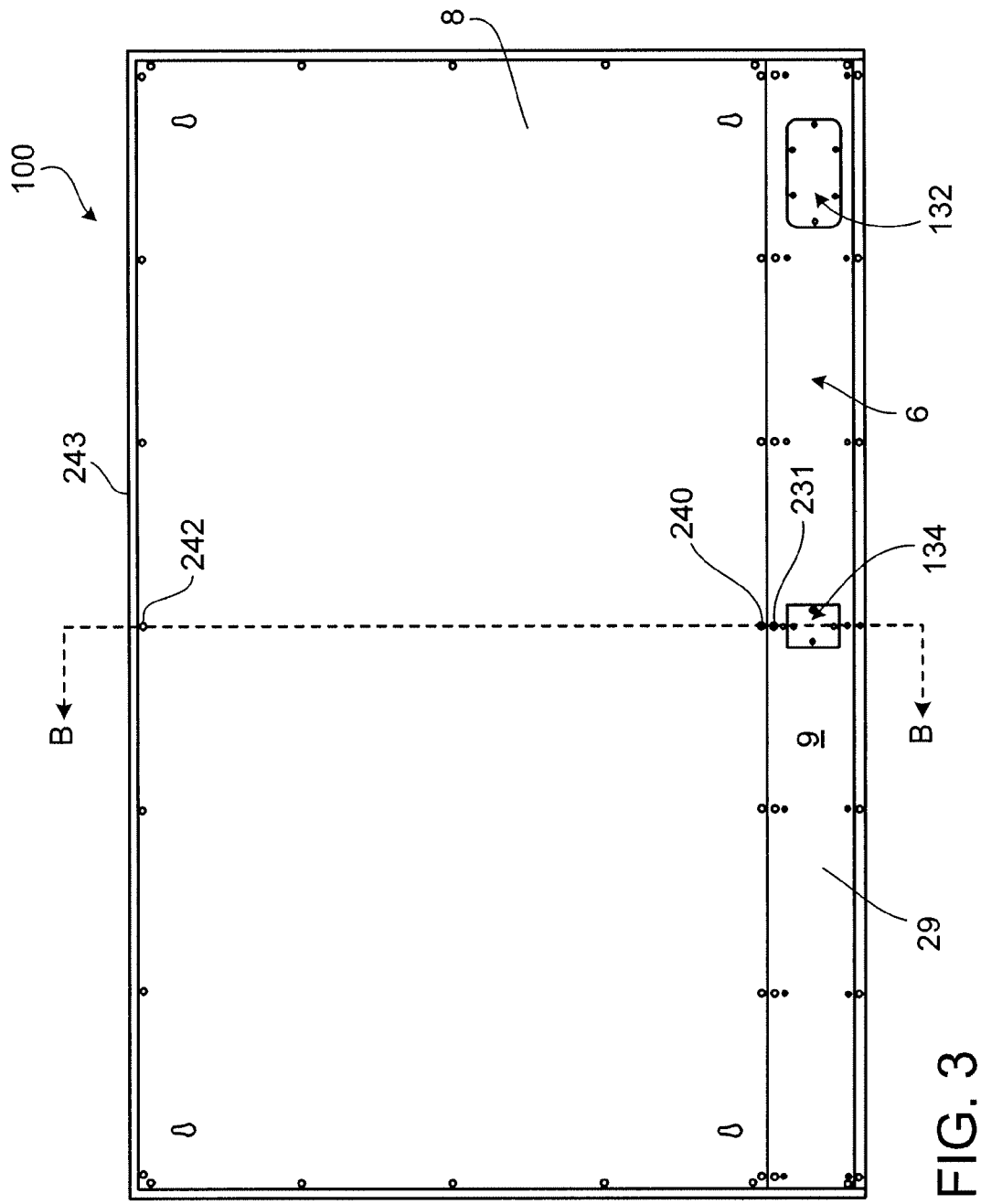
FIG. 3 shows an exemplary rear view of the display of FIG. 1.

FIGS. 1 through 3 respectively show front, side, and rear views of an electronic flat-panel display 100, such as a flat panel television. The flat-panel display comprises a flat-panel display device 2 (e.g., an LED display, LCD display, OLED display, plasma display) and display circuitry (described below) that may be housed in an electronics bay 6. The display device may comprise a display area having four sides defining a display length Y (FIG. 1), a display height X (FIG. 1), and thickness T (FIG. 2). A frame, which houses and supports the display 2 and the circuitry within the bay 6, may preferably be constructed from aluminum or any other light weight thermally conductive material. Although shown as assembled from several individual components, the frame may be a single unitary component, e.g., die cast or injection molded. Although labeled according to function in the description that follows, these portions of the frame are not necessarily separate components and may or may not have material properties that differ from other portions of the frame. The frame may include an outer frame 243, a thermally conductive back panel 8, and a rear bay panel 9. Although the thermally conductive back panel 8 is shown covering the back of the display area, it may optionally cover the electronics bay. The back panel 8 may also comprise several individual panels to meet the assembly and service requirements of the display. As shown in FIG. 3, the rear bay panel 9 covers the back region of the circuitry bay 6 and includes two rectangular openings (discussed below) for receiving the front-end and regulator circuit modules each of which may include an integral base plate which forms a cover for its respective opening. The back panel 8 and rear bay panel 9 are preferably formed entirely of a thermally conductive material such as aluminum. Alternatively, a composite construction of various layers or components may be used to provide mechanical stability and thermal conductivity. The back panel 8 and rear bay panel 9 are preferably thermally coupled to each other, to other portions of the frame, and to heat dissipative portions of the electronics circuitry as described below.

Figure 4:
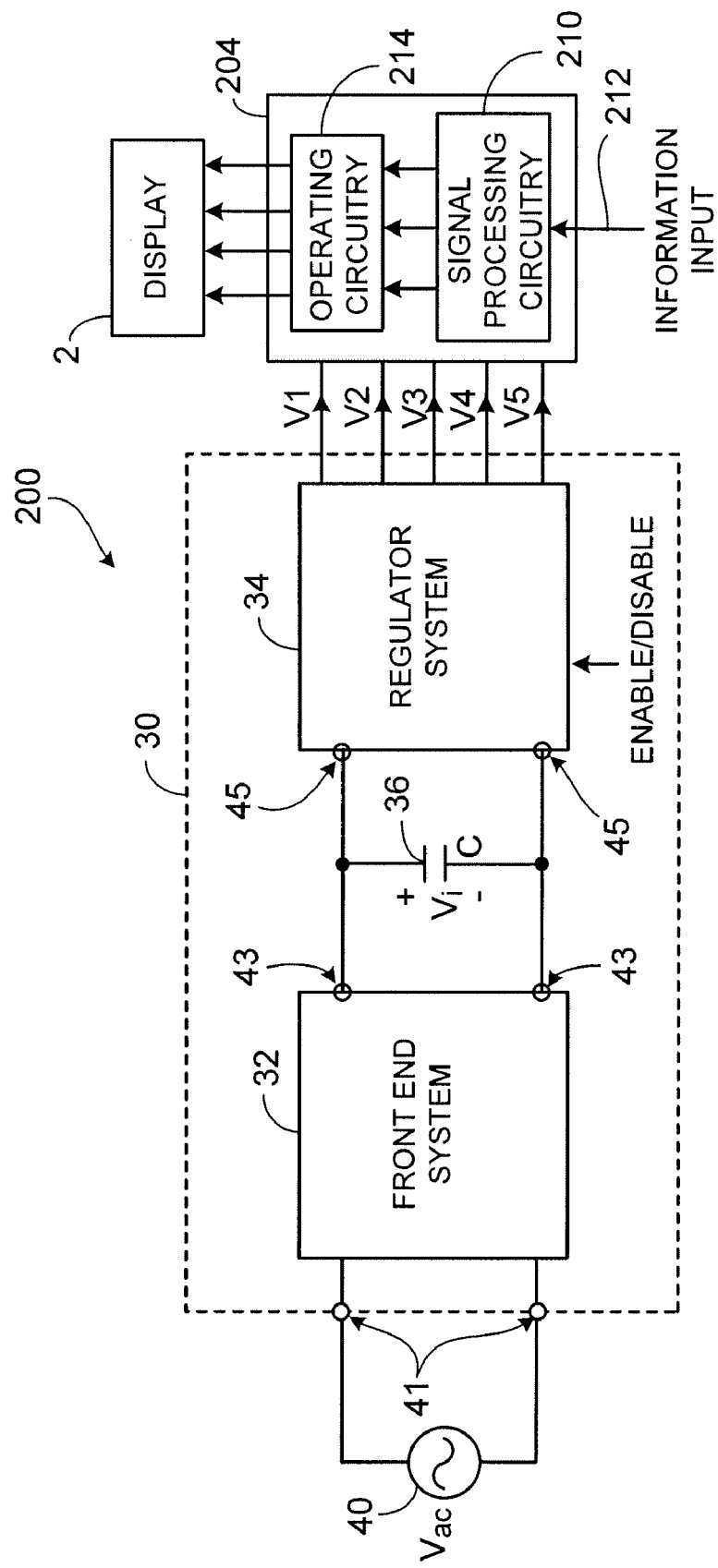
FIG. 4 shows an exemplary schematic diagram showing display circuitry.

A simplified schematic of exemplary display circuitry 200 of an electronic flat-panel display 100 is shown in FIG. 4. As shown, display circuitry 200 may include electronic circuitry 204, such as signal processing circuitry 210 for receiving an electronic information input 212, such as component, composite, broadcast, or cable TV inputs, which may define the appearance of the picture to be displayed by the display device 2. The electronic circuitry may also include display operating circuitry 214 for generating electronic signals suitable for operating the display device 2. Power supply circuitry 30 may convert power from an AC source 40 and provide one or more DC output voltages, e.g., DC voltages V1 through V5 (FIG. 4), to power the display 2 and the electronic circuitry 204.

Referring to FIG. 4, the power supply circuitry 30 may include an input 41 for connection to the AC source 40, a front-end system 32, including front end circuitry for providing a unipolar voltage, Vi, via output 43 to an input 45 of a regulator system 34. The regulator system 34 may include regulation circuitry for converting the unipolar voltage, Vi, delivered by the front-end system 32, into the one or more voltages, i.e., voltages V1-V5, for powering the display 2 and associated electronic circuitry 204. The front-end system 30 may perform the functions of isolation and voltage-transformation. For example, the unipolar voltage, Vi, delivered by the front-end system may be galvanically isolated from the AC source and may be transformed by the front-end to a voltage magnitude that is scaled relative to the magnitude of the AC source.

The regulator system 34 may include regulation circuitry to provide the regulation function, in which one or more of the regulator output voltages, V1-V5, are controlled to be at pre-determined values, despite variations in the voltage, Vi, delivered by the front-end system 32 and variations in power drawn by the circuitry 204 and display 2. In one example, the AC source 40 may vary over a range from 100 VAC, rms to 250 VAC, rms; the front-end system may deliver an isolated voltage, Vi=48 VDC; and the regulator module 34 may deliver five output voltages: V1=24 VDC, V2=18 VDC, V3=12 VDC, V4=6 VDC and V5=5 VDC. The power supply circuitry 30 may deliver 255 Watts of power at an approximate aggregate efficiency of 85% (i.e., approximately 45 Watts of power may be dissipated as heat in the power supply circuitry).

The power supply circuitry 30 may also store energy at an intermediate voltage of the power supply (where an "intermediate voltage" is defined as one that is lower in magnitude than the input source voltage and that may be higher in magnitude than one, or more, or all of the regulator output voltages) to enable normal operation of the electronic circuitry 204 for a period of time, e.g., 20 milliseconds, following an interruption of the AC source. As shown in FIG. 4, for example, the power supply system may include energy storage capacitance 36 for storing energy at the intermediate voltage, Vi. Additionally, the power supply circuitry may include a "green" mode in which it consumes less than one watt to supply a small amount of power (e.g. under 1 Watt) via a regulated output (e.g., 5 Volts) to power supervisory circuitry in the display such as remote control receiver circuitry in a television.

The thickness (dimension T, FIG. 2) of the display 100 may be reduced by arranging some or all of the display circuitry 200 in an area adjacent to and outside of the display area, rather than behind the display as prevalent in flat panel televisions. Referring to FIGS. 1 and 3, an electronics bay 6 is shown located adjacent to the bottom of the display device 2 below and outside of the display. The display circuitry and power supply circuitry may be located in the electronics bay to reduce overall thickness of the display. The power supply circuitry is shown located in the left hand side of the electronics bay 6 in FIG. 1. As shown, a front-end system module 132, energy storage devices 136, and a regulator system module 134 are shown distributed along approximately half of the length Y of the display and electronics bay 6. The front end and regulator modules, dissipating most of the heat produced by the power supply are separated by approximately fifty percent (50%) of the display length to distribute the heat.

Figure 5:
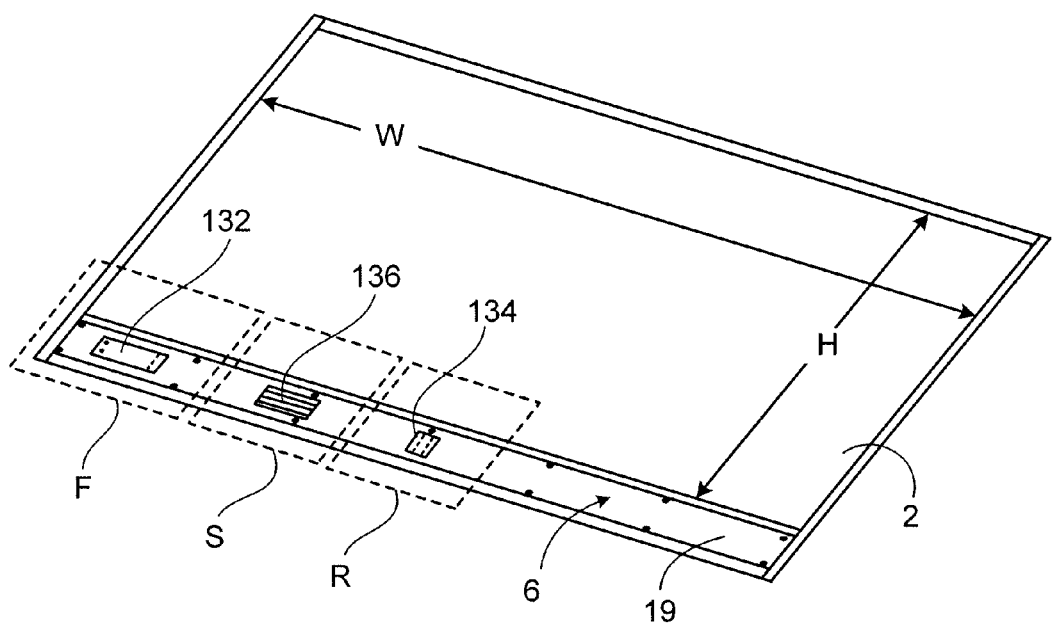
FIG. 5 shows an exemplary front perspective view of the display of FIG. 1.
Figure 6:
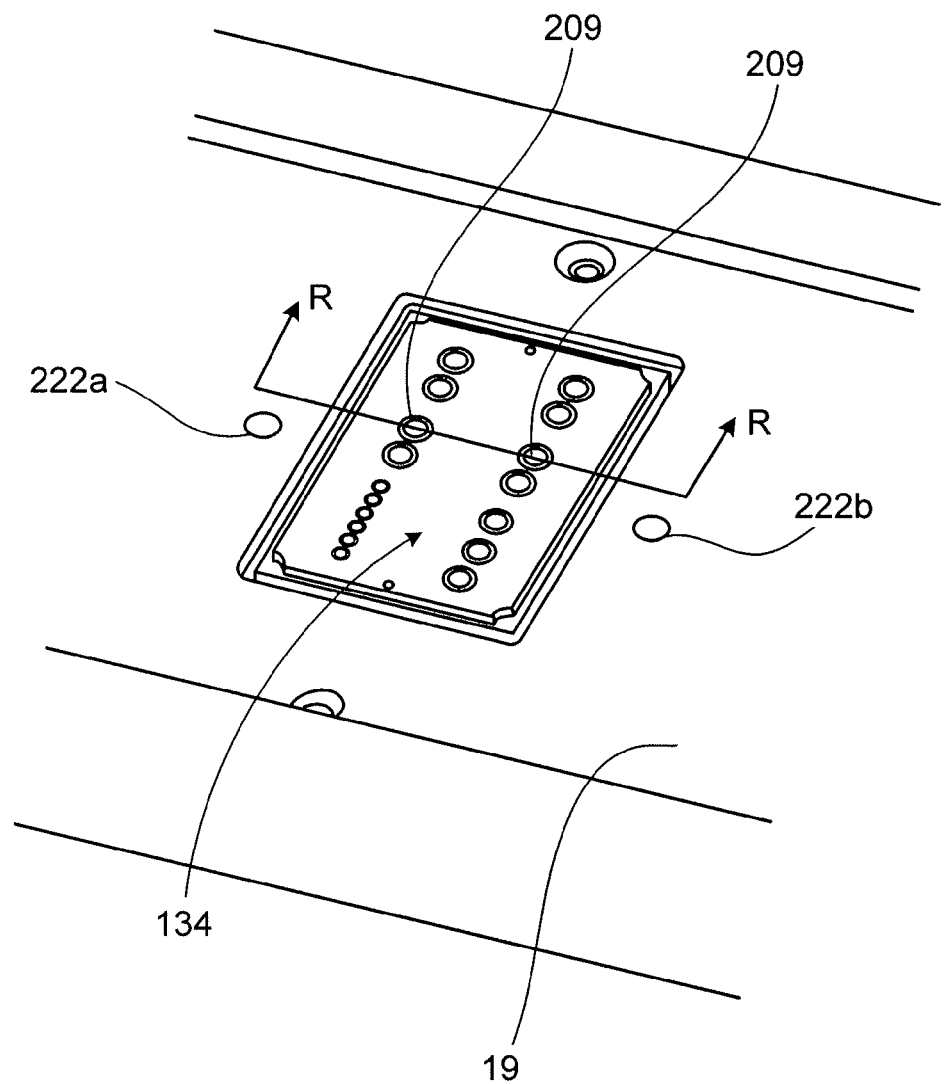
FIG. 6 shows an exemplary magnified view of a portion of the display of FIG. 5.
Figure 7:
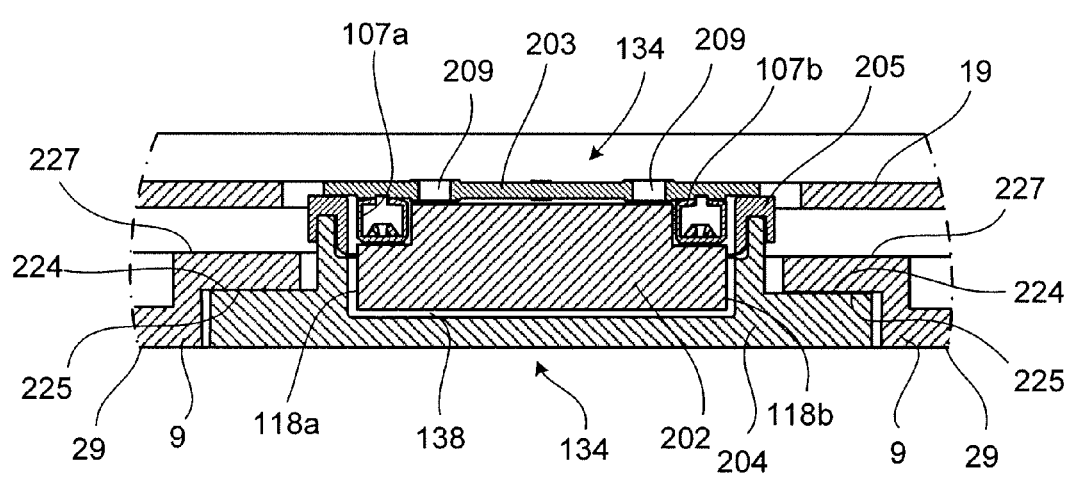
FIG. 7 shows an exemplary cross-sectional view through a portion of FIG. 6.
Figure 8:
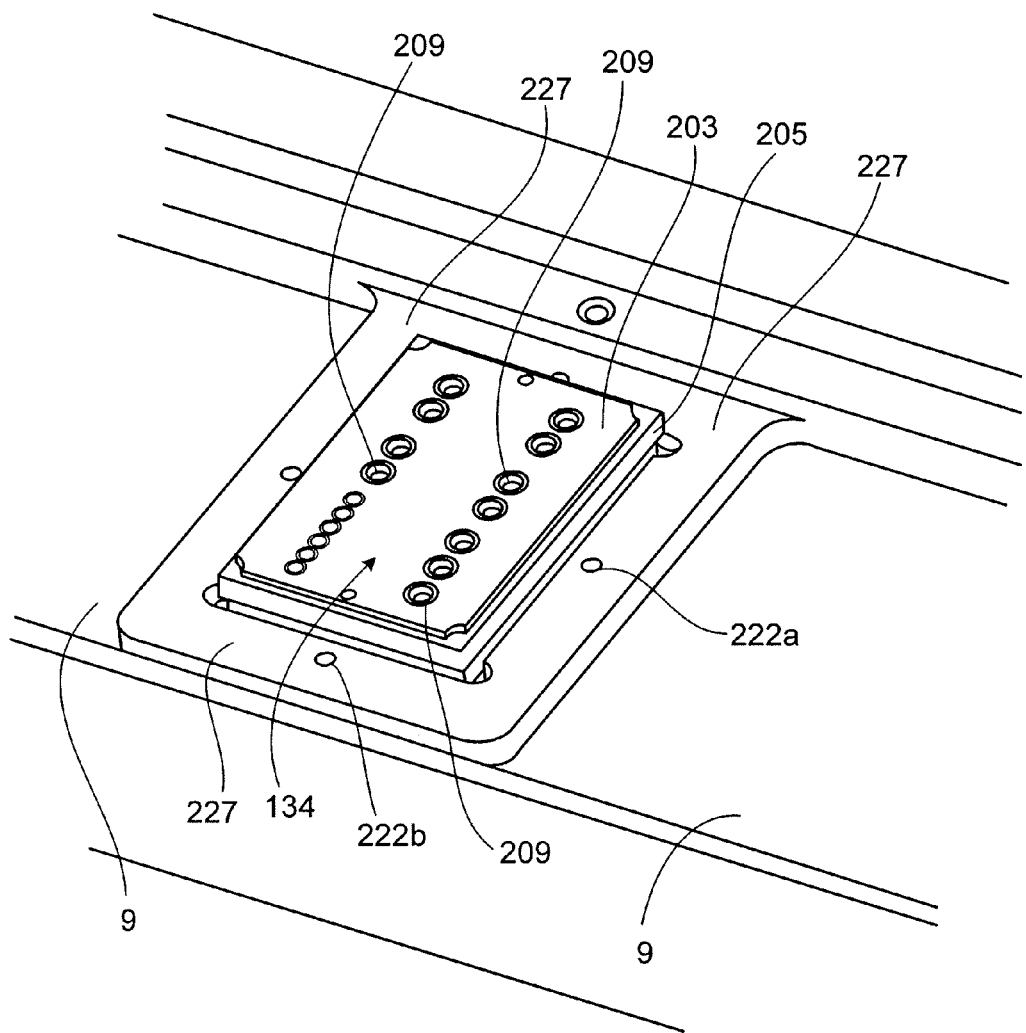
FIG. 8 shows the view of FIG. 6 with an exemplary panel and PCB removed.
Figure 9:
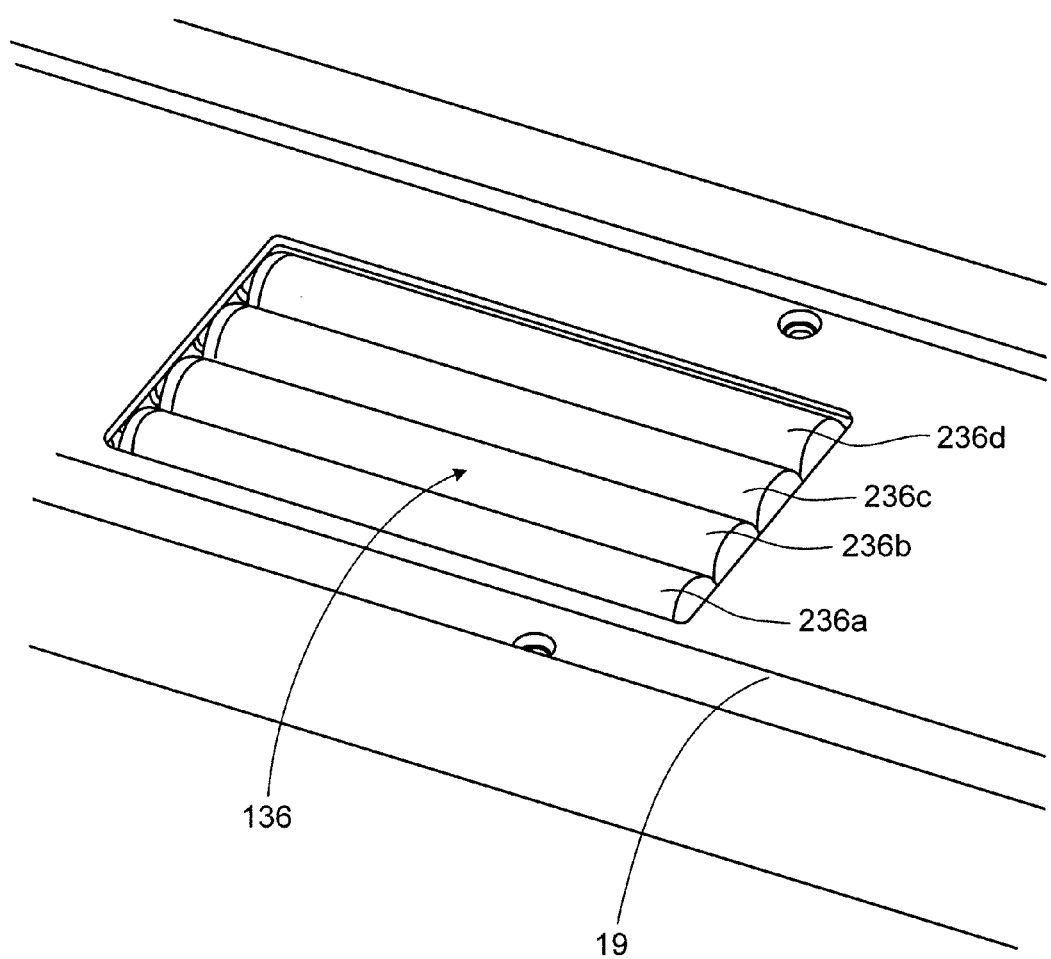
FIG. 9 shows a magnified view of an exemplary portion of the display of FIG. 5.
Figure 10:
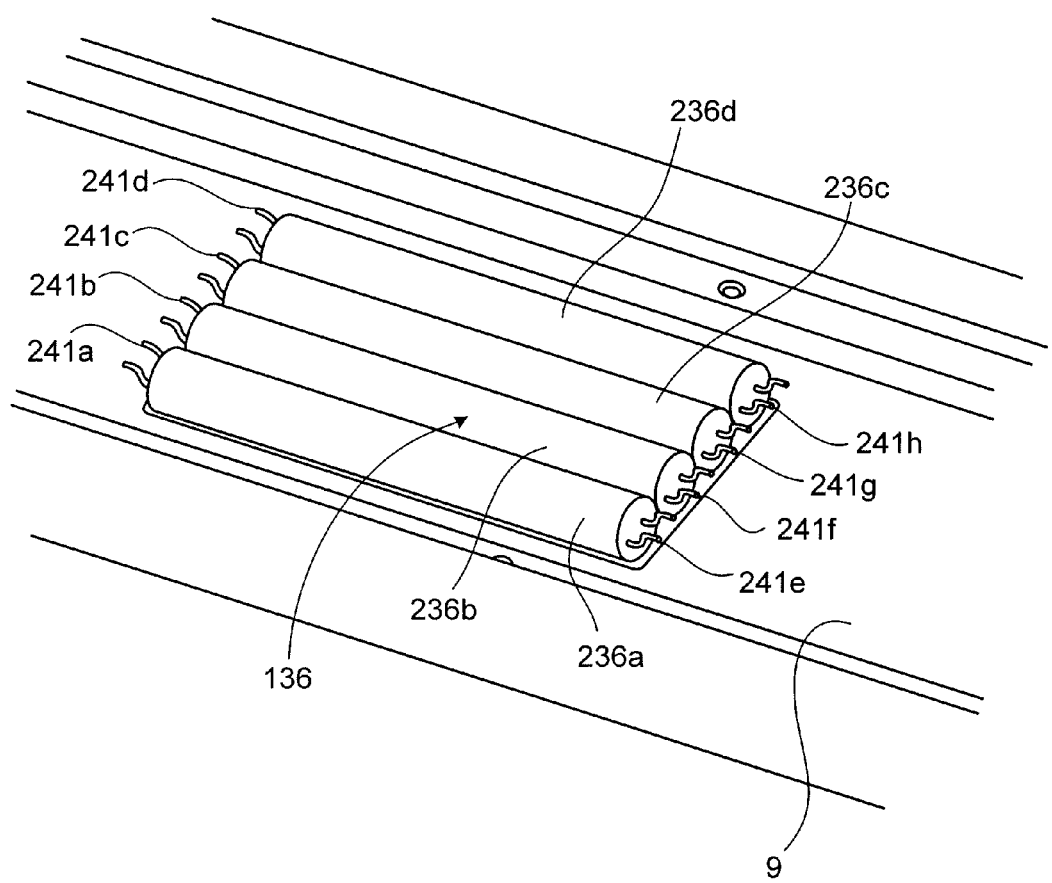
FIG. 10 shows the view of FIG. 9 with an exemplary panel and PCB removed.
Figure 11:
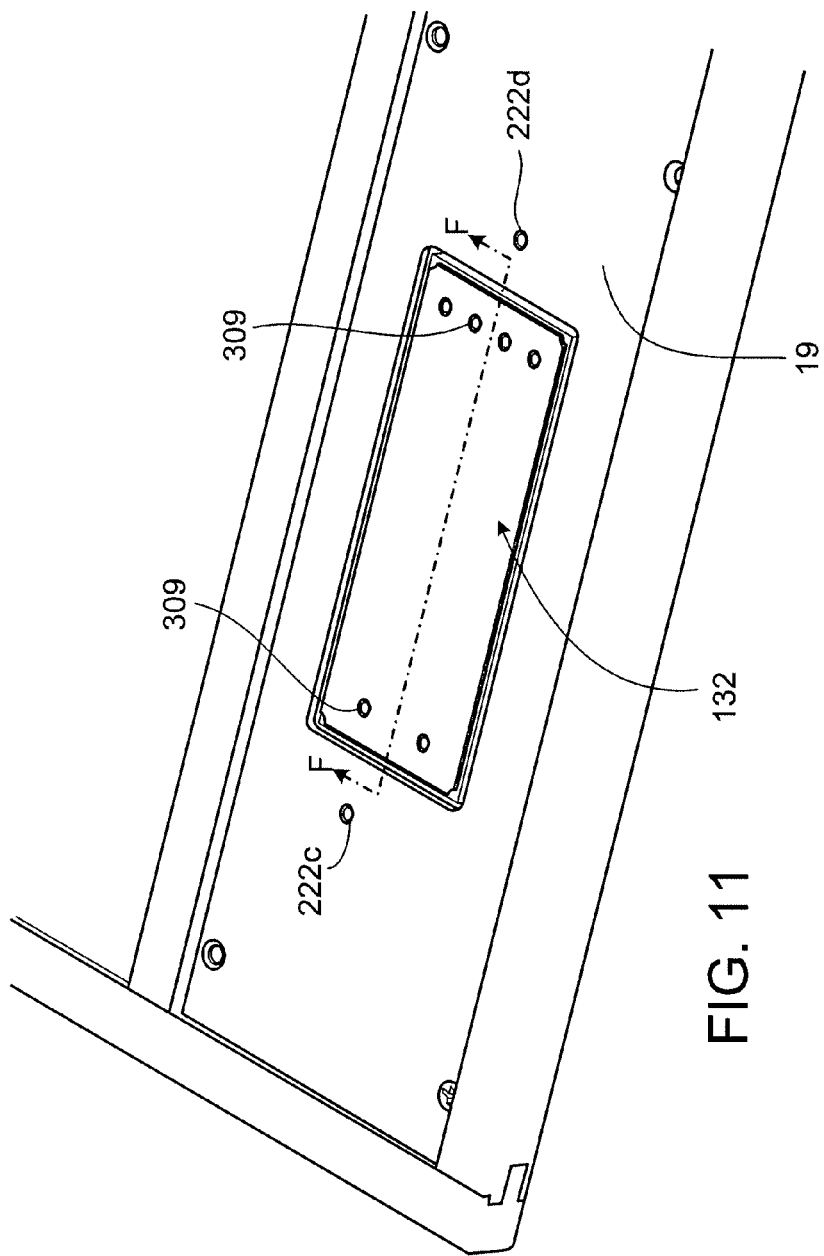
FIG. 11 shows a magnified view of an exemplary portion of the display of FIG. 5.
Figure 12:
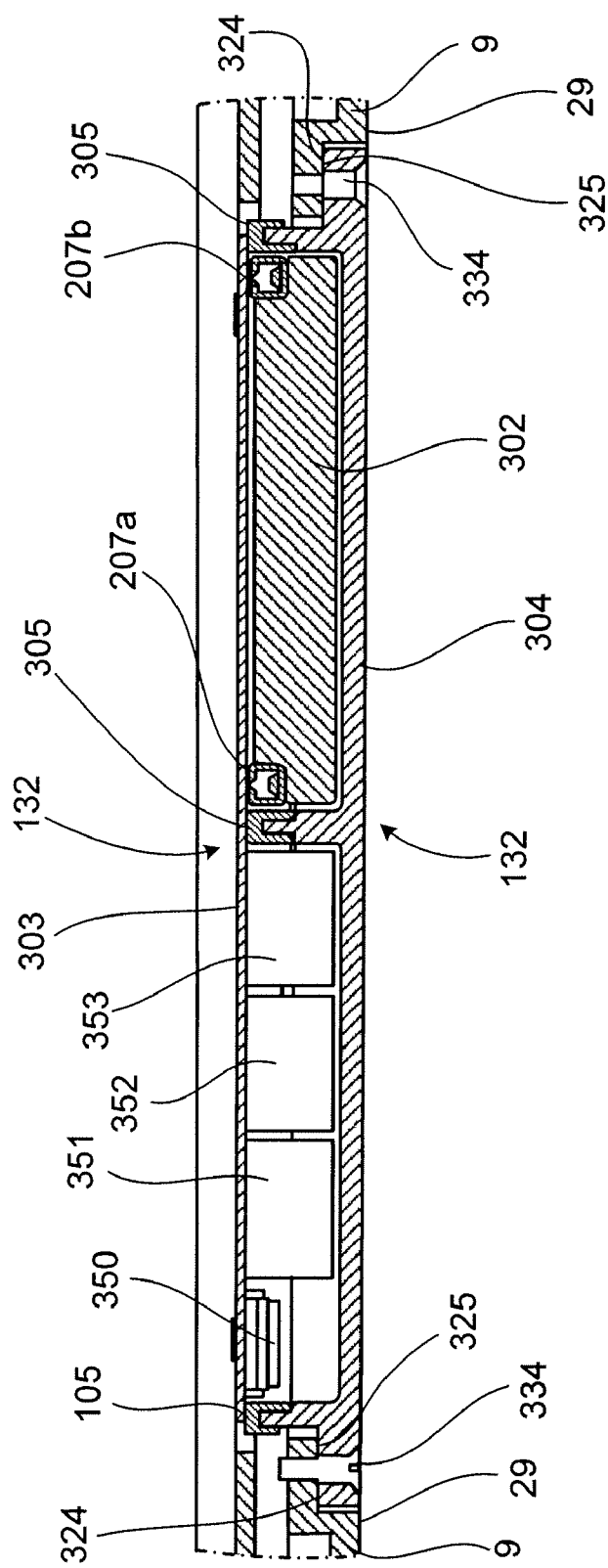
FIG. 12 shows a cross-sectional view through a portion of FIG. 11.

Details of the construction of the display 100 are shown in FIGS. 5 through 13. FIG. 5 is a perspective view of the front of the display 100. Three regions of the display F, S, and R are called out in FIG. 5. The front-end module 132 is located in region F, the energy storage devices 136 are located in region S, and the regulator system module 134 is located in region R. Magnified views of regions F, S, and R are shown in FIGS. 11, 9, and 6, respectively. Cross-sectional views of the display in regions F (through F-F in FIG. 11) and region R (through R-R in FIG. 6) are shown in FIGS. 12 and 7, respectively. Panel 19 is shown installed on the electronic bay 6 in the front perspective views of FIGS. 1, 5, 6, 9 and 11 and removed from the electronics bay 6 in the front perspective views of FIGS. 8, 10 and 13.

Referring to FIGS. 3, 7 and 8, the regulator module 134 may advantageously use the thermal packaging described in the Thermal Cavity Application and in the Thermal Cavity Provisional Application. The regulator module 134 may comprise an electronic power converter module 202, a printed circuit board (PCB) 203, a thermally conductive heat removal device 204 and an electrically insulating skirt 205. A small gap 138 between the module 202 and the heat removal device 204 may be filled with a controlled amount of thermally conductive substance (e.g., thermally conductive paste, thermally conductive epoxy) to minimize the thermal impedance of the gap. As shown in FIG. 7, and in the Thermal Cavity Application, the power converter module 202 comprises module terminals (e.g., terminals 107*a*, 107*b*), for bringing electrical power and control signals into and out of the module 202, that are arranged in rows and located on overhang surfaces that run along the length of the module 202. The module terminals may be soldered to pads (not shown) on the PCB 203 and connected, via conductive traces on PCB 203, to conductive pads 209 on PCB 203. As discussed in the Thermal Cavity Application, the module 202 may be overmolded with a thermally conductive molding compound for conducting heat from heat generating components inside of the module (not shown) to the outer surfaces of the module. As also discussed in the Thermal Cavity Application, a substrate within the module (not shown) may provide electrical connections between internal components and may also be arranged to conduct heat from heat generating devices inside the module to "selected areas" of perimeter side surfaces of the module (e.g., perimeter side surfaces 118a, 118b, FIG. 7).

Figure 14:
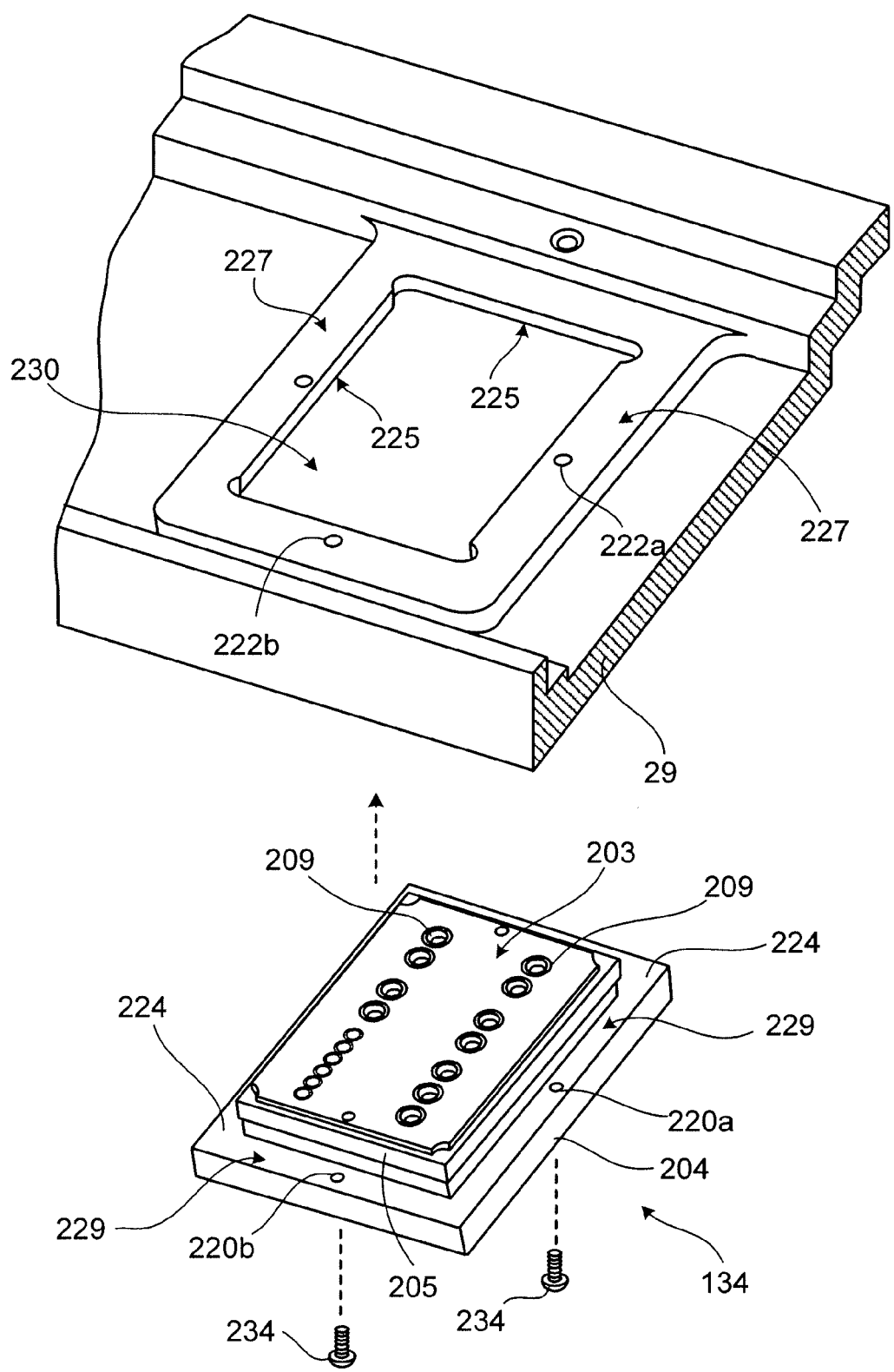
FIG. 14 shows an exploded version of the view of FIG. 8.
Figure 15:
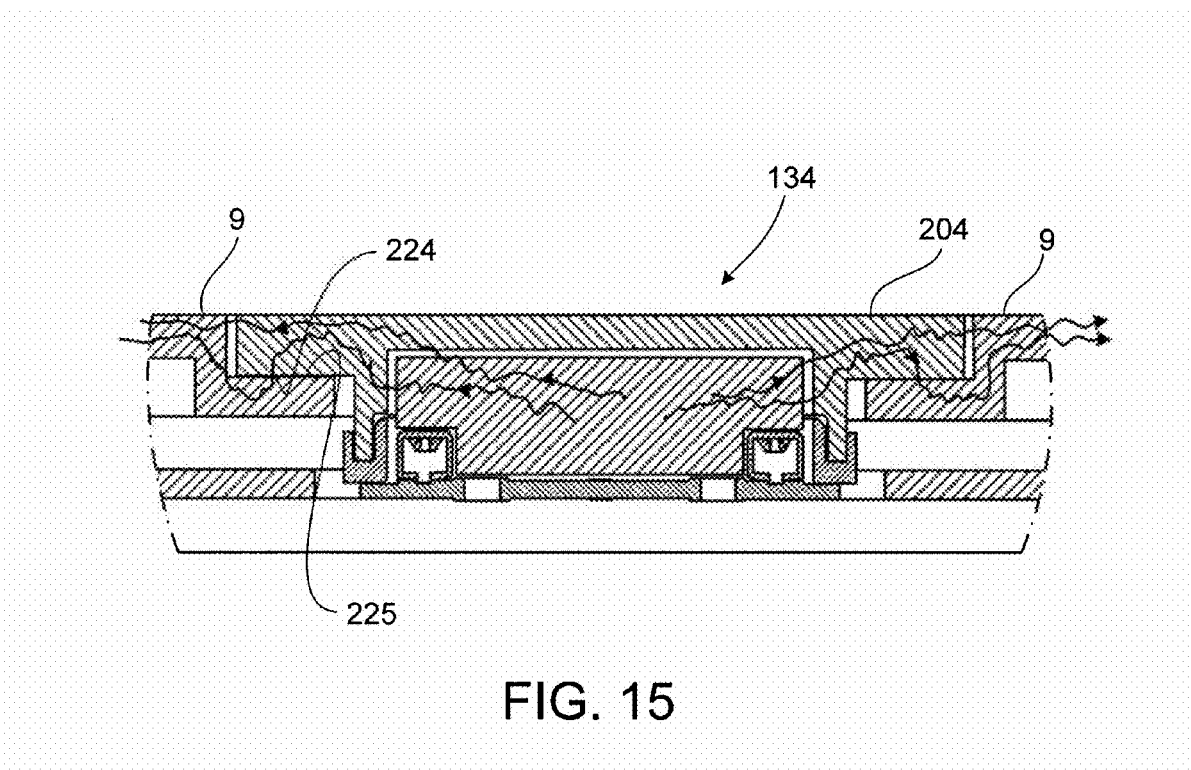
FIGS. 15-17 illustrate exemplary heat flow in a flat-panel display.

With reference to FIGS. 7, 8 and 14, the regulator module 134 is installed into a first aperture 230 in the rear bay panel 9. The aperture 230 is surrounded by a flange 227 having an inside flange surface 225 that is recessed relative to the back side 29 of a thermally conductive portion of the rear bay panel 9. The heat removal device 204 on the regulator module 134 also comprises a flange 229, the lower surface 224 of which is arranged to match the inside flange surface 225 on flange 227. When the module 134 is installed, the two flange surfaces 224, 225 are in contact with each other, providing a thermal path for heat to pass from the heat removal device 204 into the rear bay panel 9, as illustrated by the wavy lines in FIG. 15. The regulator module 134 may be mounted to the rear bay panel 9 by means of screws (e.g., screws 234) and screw holes (e.g., screw 220a, 220b, 222a, 222b). A thermally conductive material (e.g., thermally conductive paste, thermally conductive epoxy) may be placed between the flange surfaces 224, 225 to minimize the thermal impedance between the regulator module 134 and the rear bay panel 9.

Figure 13:
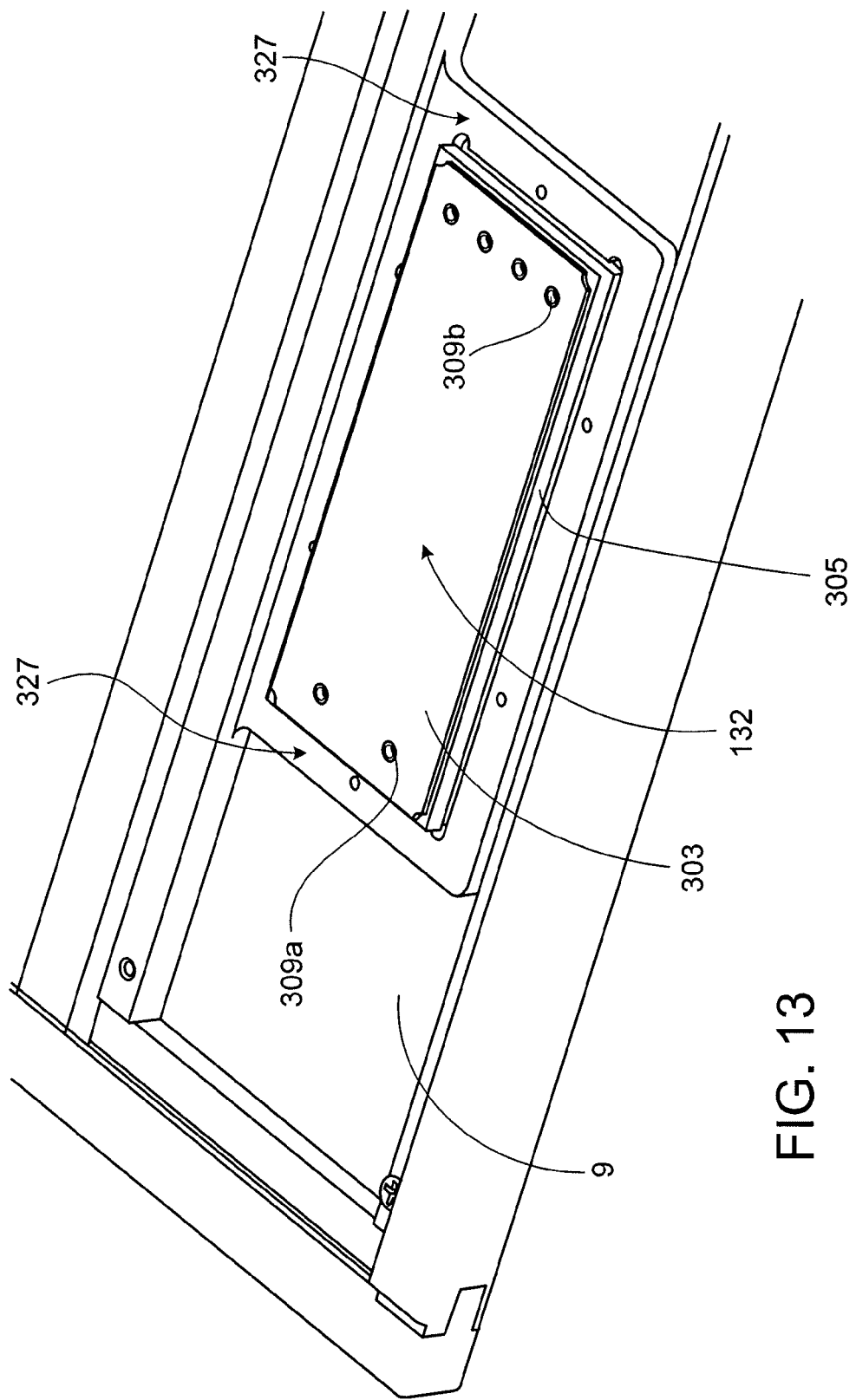
FIG. 13 shows the view of FIG. 11 with a panel and PCB removed.

As shown in FIGS. 12 and 13, the front-end system module 132 may have dimensions different from those of the regulator module 134. The front-end module 132 may contain a power conversion module 302, constructed similarly as described above (with reference to FIGS. 3, 7, 8) for the module 202 in the regulator module 134, for performing, e.g., isolation and voltage transformation. The front-end module 132 may also contain components (e.g., components 350-353) that perform rectification and filtering.

Figure 16:
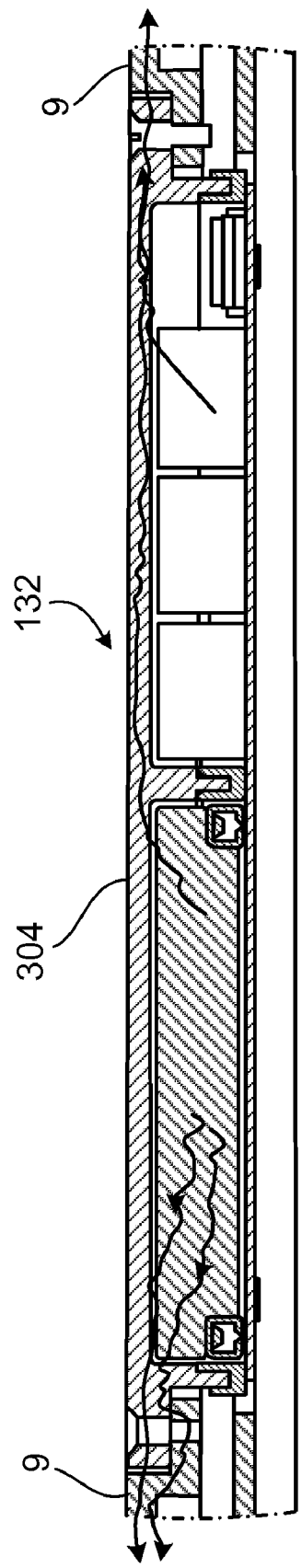

Installation of the front-end system module 132 may be done in the same fashion as was described above for installation of the regulator module 134. With reference to FIGS. 12 and 13, a surface 324 on a flange on the heat removal device 304 is arranged to match an inside flange surface 325 on flange 327 on rear bay panel 9. When the front-end module 132 is installed, the two flange surfaces 324, 325 are in contact with each other, providing a thermal path for heat to pass from the heat removal device 304 into the rear bay panel 9, as illustrated by the wavy lines in FIG. 16. The front-end module 132 may be mounted to the rear bay panel 9 by means of screws (e.g., screws 334). A thermally conductive material (e.g., thermally conductive paste, thermally conductive epoxy) may be placed between the flange surfaces 324, 325 to minimize the thermal impedance between the front-end module 132 and the rear bay panel 9.

Panel 19 may be or may include a printed circuit board (PCB) or similar connection structure. The electronic circuitry 204 may be mounted on or interconnected by the PCB (or similar interconnection structure) or both. For example, the PCB may be used to make connections between the display circuitry including the connections between the front-end system module 132, the energy storage devices 136 and the regulator system module 134, as illustrated in FIG. 4. Note that some of the display circuitry, such as modules 132 and 134 discussed above, may include mounting structure separate from or in addition to support afforded by the PCB.

With reference to FIGS. 6, 7 and FIGS. 11, 12, pads 209, 309 on the regulator module 134 and the front-end system module 132 may be connected to pads 222a-222d, on panel 19 using for example soldered wires, soldered lead frames, flexible or rigid printed circuit assemblies or connectors. With reference to FIGS. 9 and 10, the energy storage devices 136 may comprise four tubular storage capacitors 236a-236d comprising conductive leads (e.g., leads 241a-241h) that may be connected (e.g., by solder) to pads on the underside of PCB panel 19 (not shown). Thus, PCB panel 19 may be used to interconnect the regulator module 134, the front-end system module 132, and the energy storage devices 136, as illustrated in FIG. 5.

Figure 17:
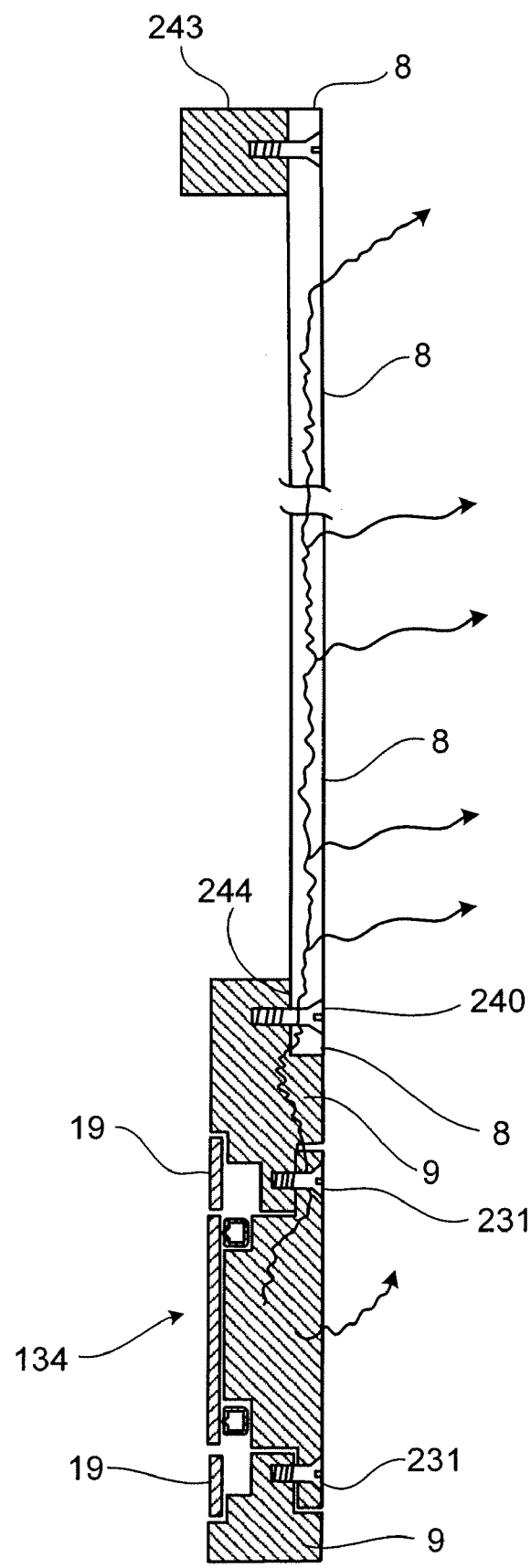

FIG. 17 is a simplified cross-section of the electronic display 100, taken through the section labeled B-B in FIG. 3. With reference to FIGS. 1, 3 and 17, the thermally conductive back panel 8 may be attached to the rear bay panel 9 by means of screws (e.g., screw 240). Heat generated by the module 134 may be conducted into the rear bay panel 9 and then conducted into the back panel 8, as illustrated by the wavy lines in FIG. 17. A thermally conductive material (e.g., thermally conductive paste, thermally conductive epoxy) may be placed in the contact region 244 between the back panel 8 and the rear bay panel 9 to minimize the thermal impedance between the two. The relatively very large combined surface area of the rear bay panel 9 and back panel 8 when used to dissipate the heat generated by display circuitry in particular in the front-end system module 134, regulator module 132, and other circuitry provides for a low effective thermal impedance between the display circuitry and the ambient air or wall on which the display is mounted and may eliminate the need for additional cooling apparatus (e.g., heat sinks, fans).

By locating some or all of the display circuitry 200 in areas adjacent to and outside of the display area, and by efficiently conducting heat from display circuitry to the large rear surface area of the display, a significant reduction in the overall thickness (dimension T, FIG. 2) of the display 100 may be facilitated. It will be appreciated from FIGS. 1, 3, and 5 that the front end system 132 and the regulator 134 are mounted in respective portions of the frame and separated by a distance from each other which may help to better distribute the heat generated internally by their respective circuits during operation. The separation between the front end and regulator or alternatively the length over which the power supply components may be distributed may be ten percent (10%), twenty five percent (25%), fifty percent (50%), or more of the length of a side of the display, depending upon various factors including the size of the display, the amount of power dissipated by the components, and the form and layout of the display. Although the illustrative examples show the electronics located along the bottom side of the display, any peripheral arrangement of the circuitry may be used. The circuitry may be distributed for example along two or more sides of the display (in which case the separation distance may approach one hundred percent (100%) of the display length) for a more symmetrical appearance or to further disperse heat dissipating portions of the circuitry.

It will also be appreciated from FIGS. 1-5, that the display and electronic circuitry for powering and operating the display may be contained within a space bounded by the height, width, and thickness of the display frame which may be less than or equal to 13 or 10 mm.

A number of embodiments have been described. Nevertheless, it will be understood that various modifications may be made. For example, the regulator system may comprise a multiplicity of regulator circuits or regulator modules at different locations to provide the plurality of DC output voltages. Some, all, or none of the regulator circuits or modules may be mounted to the frame. Some, all, or none of the regulator circuits or modules may be located on a circuit board, e.g., with the display circuitry. Similarly, some, all or none of the regulator circuits or modules may be thermally coupled to the frame to disperse and dissipate heat. Different packaging options for the front end circuitry may be used.

Generally, advantageous results may be achieved if the steps of the disclosed techniques were performed in a modified sequence, if components in the disclosed systems were combined in a different manner, or if the described components were replaced or supplemented by other components. For example, some display circuitry that meets a maximum height requirement may be located behind the display while the other circuitry exceeding the maximum height requirements may be located as shown outside adjacent the display. Accordingly, other embodiments are within the scope of the following claims.

What is claimed is:

1. A method of making a thin flat panel display comprising:
providing a display comprising a display area having four sides defining a display length and a display height;
providing electronic circuitry to operate the display;
providing power supply circuitry to convert power from an AC source and provide a plurality of DC output voltages to power the display and electronic circuitry;
dividing the power supply circuitry into a front end system and a regulator system, the front end system having an input for connection to the AC source and an output for providing a unipolar voltage to an input of the regulator system, the regulator system having a plurality of outputs for providing the plurality of DC output voltages;
providing in the front end system the functions of voltage transformation and isolation;
providing in the regulator system the function of voltage, current or power regulation;
providing energy storage for connection to an intermediate voltage of the power system;
arranging the front end system in an area adjacent to and outside of the display area along one or more of the sides of the display area;
arranging the regulator system in an area adjacent to and outside of the display area along one or more of the sides of the display area; and
providing a frame including a thermally conductive portion thermally coupled to the front end system for spreading heat dissipated by the power supply circuitry.

2. A method of operating a thin flat panel display, comprising:
from an area outside of a display area of the display, dissipating heat from a front end power supply system, through a thermally conductive portion of a frame of the display, the front end power supply system being adapted to be electrically connected to an AC source; and from a separate area outside of the display area, dissipating heat from a regulator system that is distinct from the front end power supply system, the regulator sytem being electrically connected to the front end power supply system and adapted to convert a voltage from the front end power supply system to supply DC voltages that are used to power the display.

3. A flat panel display comprising:
a display comprising a display area having four sides defining a display length and a display height;
electronic circuitry to operate the display, the electronic circuitry comprising a) a front-end circuit configured to receive power from an AC power source and convert the received power to a unipolar voltage, and b) a regulator circuit that receives the unipolar voltage and provides a plurality of DC output voltages to power the display and corresponding display driver circuitry; and
a thermally conductive frame to which the display is attached and on which the electronic circuitry is mounted, the thermally conductive frame having a thickness that is generally perpendicular to the display length and display height;
wherein the front-end circuit is mounted in a first portion of the frame, and the regulator circuit is mounted in a second portion of the frame, wherein the first portion and second portion are separated by a threshold distance.

4. The flat panel display of claim 3, wherein the first portion and the second portion are disposed adjacent to one side of the display, and wherein the threshold distance comprises at least 10% of a length of the one side.

5. The flat panel display of claim 3, wherein the first portion and the second portion are disposed adjacent to one side of the display, and wherein the threshold distance comprises at least 25% of a length of the one side.

6. The flat panel display of claim 3, wherein the first portion and the second portion are disposed adjacent to one side of the display, and wherein the threshold distance comprises at least 50% of a length of the one side.

7. The flat panel display of claim 3, wherein the thickness is less than or equal to about 13 mm, and wherein the display and electronic circuitry are disposed entirely within a space bounded by a length and width of the thermally conductive frame and the thickness.

8. The flat panel display of claim 3, wherein the thickness is less than or equal to about 10 mm, and wherein the display and electronic circuitry are disposed entirely within a space bounded by a length and width of the thermally conductive frame and the thickness.

9. The flat panel display of claim 3, wherein the thermally conductive frame comprises aluminum.

10. A flat panel display comprising:
a display comprising a display area having four sides defining a display length and a display height;
electronic circuitry to operate the display, the electronic circuitry comprising a) a front-end circuit configured to receive power from an AC power source and convert the received power to a unipolar voltage, and b) a regulator circuit that receives the unipolar voltage and provides a plurality of DC output voltages to power the display and corresponding display driver circuitry; and
a thermally conductive frame to which the display is attached and on which the electronic circuitry is mounted;
wherein the front-end circuit is mounted in a first portion of the frame, and the regulator circuit is separately mounted in a second, different portion of the frame, and wherein the first portion and second portion are separated by a threshold distance.

11. The flat panel display of claim 10, wherein the display length and the display height have a ratio of approximately 15:9, wherein the display area comprises at least about 775 square inches.

12. The flat panel display of claim 10, wherein the display area comprises at least about 775 square inches.

13. The flat panel display of claim 10, wherein the display area comprises at least about 1275 square inches.

14. The flat panel display of claim 10, wherein the display area comprises at least about 1575 square inches.

15. The flat panel display of claim 10, wherein the display area comprises at least about 175 square inches, and wherein the display length and the display height have a ratio of approximately 1280:1024.

16. The flat panel display of claim 10, wherein the thermally conductive frame has a thickness that is generally perpendicular to the display length and display height, within which the display and electronic circuitry are disposed.

17. The flat panel display of claim 10, wherein the thickness is less than about 13 mm.

18. The flat panel display of claim 10, wherein the thickness is less than about 10 mm.

19. The method of claim 1 further comprising separating the front end system from the regulator system by a threshold distance of at least 10 percent of the display length.

20. The method of claim 1 further comprising thermally coupling a portion of the regulator system to the frame.

21. The method of claim 20 wherein the regulator system comprises a module and the module is mounted to the frame.

22. The method of claim 21 wherein the regulator system further comprises a regulator circuit external to the module.

23. The method of claim 21 further comprising separating the module from the front end system by a threshold distance of at least 10 percent of the display length.

\* \* \* \* \*

UNITED STATES PATENT AND TRADEMARK OFFICE
CERTIFICATE OF CORRECTION

| | |
|---|---|
| PATENT NO. | : 8,085,541 B1 |
| APPLICATION NO. | : 12/423447 |
| DATED | : December 27, 2011 |
| INVENTOR(S) | : Patrizio Vinciarelli et al. |

Page 1 of 1

It is certified that error appears in the above-identified patent and that said Letters Patent is hereby corrected as shown below:

Col. 4, line 42, delete "(the Thermal" and insert -- (the "Thermal --.

Col. 9, line 42, claim 2, delete "system," and insert -- system --.

Col. 9, line 48, claim 2, delete "sytem" and insert -- system --.

Signed and Sealed this
Thirteenth Day of March, 2012

David J. Kappos
*Director of the United States Patent and Trademark Office*